United States Patent [19]

Kirihata

[11] Patent Number: 5,831,913

[45] Date of Patent: Nov. 3, 1998

[54] METHOD OF MAKING A MEMORY FAULT-TOLERANT USING A VARIABLE SIZE REDUNDANCY REPLACEMENT CONFIGURATION

[75] Inventor: Toshiaki Kirihata, Wappingers Falls, N.Y.

[73] Assignee: International Business Machines Corporation, Armonk, N.Y.

[21] Appl. No.: 825,948

[22] Filed: Mar. 31, 1997

[51] Int. Cl.[6] .................................................. G11C 7/00
[52] U.S. Cl. ................. 365/200; 365/225.7; 365/230.03; 365/230.06
[58] Field of Search .............................. 365/200, 230.03, 365/230.06, 225.7; 371/10.2

[56] References Cited

U.S. PATENT DOCUMENTS

| | | | |
|---|---|---|---|
| 5,295,101 | 3/1994 | Stephens, Jr. et al. | 365/200 |
| 5,430,679 | 7/1995 | Hiltebeitel et al. | 365/200 |
| 5,459,690 | 10/1995 | Rieter et al. | 365/200 |
| 5,475,648 | 12/1995 | Fujiwara | 365/230.06 |
| 5,491,664 | 2/1996 | Phelan | 365/200 |
| 5,691,945 | 11/1997 | Liou et al. | 365/200 |
| 5,691,946 | 11/1997 | DeBrosse et al. | 365/200 |
| 5,703,817 | 12/1997 | Shiratake et al. | 365/200 |
| 5,724,295 | 3/1998 | Beiley et al. | 365/200 X |

OTHER PUBLICATIONS

H. L. Kalter, et al. "A 50–ns 16–Mb DRAM with a 10–ns Data Rate and O–Chip ECC" IEEE Journal of Solid–State Circuits, V. 25, Oct. 1990, pp. 1118–1128.

T. Kirihata, et al. "A 14–ns 4–Mb CMOS DRAM with 300–mW Active Power" IEEE Journal of Solid–State Circuits, V. 27, Sep. 1992, pp. 1222–1228.

T. Sugibayashi, et al, "A 30 ns 256 Mb DTAM with Multi–Divided Array Structure" IEEE Journal of Solid–State Circuits, V. 28, Nov. 1993, pp. 1092–1098.

T. Kirihata, et al, "Fault–Tolerant Designs for 256 Mb DRAM" IEEE Journal of Solid–State Circuits, V. 31, Apr. 1996, pp. 558–566.

*Primary Examiner*—Do Hyun Yoo
*Attorney, Agent, or Firm*—H. Daniel Schurmann

[57] ABSTRACT

A method of making a memory fault-tolerant through the use of a variable size redundancy replacement (VSRR) circuit arrangement. A redundancy array supporting the primary arrays forming the memory includes a plurality of variable size redundancy units, each of which encompassing a plurality of redundant elements. The redundant units used for repairing faults in the memory are independently controlled. All the redundancy elements within a repair unit are preferably replaced simultaneously. The redundancy elements in the redundancy unit are controlled by decoding address lines. The variable size that characterizes this configuration makes it possible to choose the most effective redundancy unit, and in particular, the one most closely fitting the size of the cluster of failures to be replaced. This method significantly reduces the overhead created by added redundancy elements and control circuitry, while improving the access speed and reducing power consumption. Finally, a fault-tolerant block redundancy controlled by a priority decoder makes it possible to use VSRR units for repairing faults in the block redundancy prior to its use for replacing a defective block within the memory.

14 Claims, 13 Drawing Sheets

METHOD OF MAKING A MEMORY FAULT-TOLERANT USING A VARIABLE SIZE REDUNDANCY REPLACEMENT CONFIGURATION

RELATED APPLICATION

This application is related to U.S. patent application Ser. No. 08/825,949, entitled "Variable Size Redundancy Replacement Architecture to Make a Memory Fault-Tolerant", filed concurrently herewith, and assigned to the same assignee.

FIELD OF THE INVENTION

This invention relates to a method for making a fault-tolerant memory, and more particularly, to a method of using a variable size redundancy configuration to replace defective elements in a memory.

BACKGROUND OF THE INVENTION

CMOS technology has evolved such that the computer market has rapidly opened to a wide range of consumers. Today multimedia requires at least an 8 MB and preferably even a 16 MB memory, which increases the relative cost of the memory system within a computer. In the near future, it is likely that 32 MB and 64 MB computers will become commonplace, which suggests a potential demand for 256 Mb DRAMs (Dynamic Random Access Memory) and beyond. Despite the huge array size and lithographic difficulties that ensue, it is more important than ever to increase the chip yield. Process engineers are constantly attempting to reduce and ultimately, eliminate or at the very least, mask defects. Faults that inevitably remain in the chip are generally overcome using special circuit designs, and more specifically redundancy replacement.

Conventional redundancy configurations typically revolve about a Fixed Size Redundancy Replacement (FSRR) architecture, wherein elements are grouped in units containing a fixed number of elements, which are used to replace defective elements within the memory device.

Various configurations within the FSRR architecture have been successfully implemented over the years. A typical FSRR configuration, which is commonly used for low density DRAMs is shown in FIG. 1a. Therein are depicted a fixed plurality of spares used for replacing defective elements within the memory and which are appended to each sub-array comprising the memory. Each redundancy unit (RU) is comprised of a plurality of redundancy elements (REs), (e.g., two RE per RU are illustrated therein), and which are used to repair existing faults (labeled X) within the corresponding sub-array. This scheme, labeled intra-block replacement, increases the redundancy area overhead as the number of sub-blocks increases for high density memories, since each sub-block requires its own, one or preferably two RUs. Thus, the efficiency of the RUs is rather poor in view of its inflexibility which reduces the chip yield substantially when faults are clustered in a given sub-array. The above mentioned concept is embodied in a configuration described in the article by T. Kirihata et al., entitled "A 14 ns 4 Mb DRAM with 300 mW Active Power", published in the IEEE Journal of Solid State Circuits, Vol. 27, pp. 1222–1228, September 1992.

Another FSRR redundancy replacement arrangement, known as a flexible redundancy replacement configuration is shown in FIG. 1b, wherein a memory is depicted having a single array of RUs to selectively replace failing elements anywhere in the memory. In this configuration, REs within the RU can repair faults (labeled X) located in any sub-array within the memory. The advantage of this arrangement over the previously described intra-block replacement is that one section, namely a redundancy array, having a fixed number of RUs may advantageously be used to service any number of sub-arrays forming the memory. This translates into a substantial saving of real estate over the previous scheme, although it requires a substantial amount of additional control circuitry to properly service all the sub-arrays forming the memory.

There is yet another FSSR architecture, referred to block FSRR, and shown in FIG. 1c, wherein any number of faults (including all the faults) in a sub-array are replaced with a block redundancy. The size of the prior art block FSRR coincides with that of the sub-array, the sub-array being defined as a section of memory contained between sense amplifier strips. Since in this scheme, a defective block is replaced by a good block, it ensues that all defective REs contained within a block are simultaneously replaced by good REs. Although this replacement methodology introduces a new dimension in the repairability of defects, it also brings along a significant amount of added design space to accommodate the various configurations that make this architecture so desirable. Moreover, there is a significant drawback in that block redundancy cannot be used if the redundancy block itself has a fault, even if only one. Since, by definition, a block is large, the probability of finding at least one defect in the redundancy block is high. Although the subdivision of arrays depicted in FIG. 1c is known in the art, no provisions exist to provide appropriate corrections when defects affect the block redundancy array.

More details regarding the above configurations and the various trade-offs may be found in an article by T. Kirihata et al., "A Fault-Tolerant Design for 256 Mb DRAMs", published in the Digest of Technical Papers of the 1995 Symposium on VLSI Circuits, pp. 107–108; in an article by T. Sugibayashi et al., "A 30 ns 256 Mb DRAM with Multi-divided Array Structure", published in the IEEE Journal of Solid State Circuits, Vol. 28, pp. 1092–1098, November 1993; and in an article by H. L. Kalter et al., "A 50 ns 16 Mb DRAM with a 10 ns Data Rate and On-Chip ECC", published in the IEEE Journal of Solid State Circuits, Vol. 25, pp. 1118–1128, October 1990.

In summary, a Fixed Size Redundancy Replacement (FSRR) arrangement consists of a fixed number of replacement units, each with the same number of REs to correct defects in the memory device. The flexibility of allocating a predetermined number of fixed-sized redundancy units allows the units and the control circuitry to be shared among the several memory sub-arrays, thereby significantly increasing the effective usage of the redundancy. This configuration has demonstrated its value by providing good repairability, specially of bit lines, (either single bits or multiple bits); wordlines, (either single words or multiple words), and the like, all falling under the category of "hard faults".

Yet, FSRR suffers from a distinct disadvantage in that it still requires a significant number of RUs (and corresponding control circuitry) to overcome another class of faults, labeled "retention faults", in which a bit, stored in the capacitor that forms a DRAM cell, fades away over time in a weak cell, thereby producing a fault. This problem is of utmost importance, particularly, since retention faults far exceed the number of hard faults.

Referring back to the hard faults within a memory, defects of this type tend to cluster, thereby ideally requiring a customized unit containing an equivalent number of redundancy elements. Hard faults are typically not too numerous, but their size can in itself be quite large, thereby necessitating multiple REs and/or large size REs to repair such faults. By way of example, if a sub-array contains four clustered defects, a 4-elements redundancy unit would be required to replace them. However, if five clustered defects were present, and only units containing four REs were available, the replacement of defects could potentially fail altogether in the intra-block replacement configuration (because not enough units would be available within the sub-array to service this number of faults). Similarly, a flexible replacement configuration also falls short since, in practice, only units of the "wrong size" are available to perform the repair, although flexible redundancy schemes are more likely to provide successful replacement than the intra-block replacement architecture.

Retention faults, on the other hand, occur randomly throughout the memory, and their number is typically high; yet, there is a distinct advantage in that they can be repaired with a single RE. In the intra-block replacement configuration, retention faults can only be serviced by RUs containing a fixed plurality of REs. Clearly, if RUs containing only one RE were designed with the intention of detecting randomly occurring retention faults, then such a configuration would be ideal for retention faults; yet they fall short for servicing hard faults (e.g, four units having one RE each would be needed to service a cluster of four hard faults). Retention faults are also difficult to repair even with a flexible redundancy replacement architecture because of the large number of such faults, which frequently may overwhelm the repair circuitry available in the memory device.

In view of the foregoing, the goal of an ideal redundancy configuration is to repair hard faults, retention faults, and block faults, whether randomly distributed throughout the memory or clustered therein, without introducing an onerous burden caused by a complex redundancy area overhead. Typically, this overhead is divided into: a redundancy element overhead and redundant control circuitry overhead, both of which should be minimized to achieve good repairability and maintain optimum performance of the memory.

Related redundancy configurations, including some of the categories listed above, are described in the following references:

U.S. Pat. No. 5,491,664 to Phelan, issued Feb. 13, 1996, describes the implementation of a flexible redundancy memory block elements in a divided array architecture scheme. This configuration has both, the memory and the redundancy memory blocks, coupled to a read bus to allow the redundancy memory in one memory sub-array to be shared by a second subarray.

U.S. Pat. No. 5,475,648 to Fujiwara, issued Dec. 12, 1995, in which a memory having a redundancy configuration is described such that when an appropriate address signal agrees with the address of a defective cell, a spare cell provided by the redundant configuration is activated to replace the failing one.

U.S. Pat. No. 5,461,587 to Seung-Cheol Oh, issued Oct. 24, 1995, in which a row redundancy circuit is used in conjunction with two other spare row decoders, wherein by a judicious use of fuse boxes, signal generated by a row redundancy control circuit make it possible to replace failing rows with spare ones.

U.S. Pat. No. 5,459,690 to Rieger at al., issued Oct. 17, 1995, describes a memory with a redundant arrangement that, in the presence of normal wordlines servicing defective memory cells, enables faulty memory cells to be replaced with redundant cells.

U.S. Pat. No. 5,430,679 to Hiltebeitel et al., issued Jul. 4, 1995, describes a fuse download system for programming decoders for redundancy purposes. The fuse sets can be dynamically assigned to the redundant decoders, allowing a multi-dimensional assignment of faulty rows/column within the memory.

U.S. Pat. 5,295,101 to Stephens, Jr. et al., issued Mar. 15, 1994, describes a two level redundancy arrangement for replacing faulty sub-arrays with appropriate redundancy elements.

Whereas the prior art and previous discussions have been described mainly in terms of DRAMs, practitioners of the art will fully appreciate that the above configurations and/or architectures are equally applicable to other types of memories, such as SRAMs, ROMs, EPROMs, EEPROMs, Flash RAMs, CAMs, and the like.

OBJECTS OF THE INVENTION

Accordingly, it is an object of the present invention to provide a fault-tolerant design applicable to any size memory.

It is another object of the invention to use a variable size redundant replacement arrangement to selectively replace failing elements with redundant elements of identical size.

It is a further object of the invention to use redundancy units, each of which contain a predetermined number of redundant elements.

It is still another object of the invention to improve the yield of a chip by dynamically repairing any size memory containing both hard faults and retention faults, by selecting the most effective and efficient repair unit of the most appropriate size to make the repair.

It is yet another object of the invention to simultaneously cure hard faults, retention faults and subarray faults within the memory, and to accomplish this without curing one type of faults at the expense of the other.

It is a further object of the invention to use this variable size redundancy replacement (VSRR) configuration to replace the conventional fixed size redundancy replacement (FSRR) configuration.

It is a more particular object of the invention to use a VSRR configuration in order to minimize REs and associated circuit requirements.

It is yet a further object of the invention to ensure that the repair of hard and retention faults in a memory is achieved without requiring the expenditure of additional power and without impinging on the speed of the memory.

It is still another object of the invention to provide a fault-tolerant block size redundancy replacement which allows a fault in the block redundancy to be repaired and used with other VSRR units.

It is a further object of the invention to allow a faulty RU having a predetermined plurality of REs to be repaired with a VSRR unit having less REs than that predetermined plurality.

It is yet a more particular object of the invention to repair all the faults in the memory device and in the VSRR units in parallel, while maintaining a simple, fast and low power design.

SUMMARY OF THE INVENTION

A primary aspect of the present invention is a method of providing a new and improved redundancy configuration known as a variable size redundancy replacement (VSRR), allowing for the use of a more efficient and effective replacement unit (RU) which is fully adaptable to the size of the defect. This improved VSRR is intended to eliminate the drawbacks of the more conventional FSRR (Fixed Size Redundancy Replacement) configuration that uses fixed size replacement units, regardless of the number or the size of the defects.

In accordance with one aspect of the invention, there is provided a method of making a memory fault tolerant by providing the memory device with a variable redundancy replacement arrangement, the method comprising the steps of: configuring the memory device into a plurality of primary memory arrays having each a plurality of elements; coupling a plurality of independently controlled variable size redundancy units to the primary memory arrays, the variable size redundancy units having each a plurality of redundancy elements; and replacing defective elements in the primary memory arrays with at least one of the variable size redundancy units, wherein the redundancy elements in the at least one variable size redundancy unit replace a corresponding number of the defective elements in the primary memory array.

In accordance to another aspect of the invention, there is provided a method of making a memory device fault-tolerant with a variable redundancy replacement arrangement, the method comprising the steps of: configuring the memory into a plurality of primary memory arrays having each a plurality of elements; coupling variable size redundancy units to each of the primary memory arrays, the variable size redundancy units having each a plurality of redundancy elements; and replacing defective elements in each of the primary memory arrays, wherein the redundancy elements in at least one of the variable size redundancy units are coupled to each of the primary memory arrays.

In accordance with a third aspect of the invention, there is provided a method of making a memory device fault-tolerant with a variable redundancy replacement arrangement, the method comprising the steps of: configuring a plurality of primary memory arrays having each a plurality of elements; coupling at least one variable size redundancy array to the plurality of primary memory arrays, the at least one redundancy array comprising: a plurality of independently controlled variable size redundancy units, the variable size redundancy units having each a plurality of redundancy elements; and replacing defective elements in the primary memory arrays with at least one of the variable size redundancy units, wherein the variable size redundancy unit replaces defective primary memory elements in accordance to the number of defective elements.

In accordance with a fourth aspect of the invention, there is provided a method of making a memory device faulttolerant with a variable redundancy replacement arrangement, the method comprising the steps of: providing a plurality of primary memory arrays having each a plurality of elements; coupling a plurality of independently controlled variable size redundancy units to the primary memory arrays, wherein the variable size redundancy units have each a plurality of redundancy elements; providing a block redundancy array coupled to the primary memory arrays; and replacing defective elements in the primary memory arrays and in the block redundancy array with at least one of the variable size redundancy units, wherein the redundancy elements in the at least one of the variable size redundancy units replace a corresponding number of defective elements in the primary memory array and in the block redundancy array.

BRIEF DESCRIPTION OF THE DRAWINGS

The above-mentioned objects, aspects and advantages of this invention and the manner of attaining them will become more apparent and the invention itself will be better understood by reference to the following description of embodiments of the invention taken in conjunction with the accompanying drawings, the description of which follows.

FIG. 4b is a timing diagram applicable to the VSRR configuration shown in FIG. 4a.

FIG. 5b is the timing diagram applicable to the block diagram of FIG. 5a.

FIG. 6a depicts a typical fuse latch arrangement FLAT and a master fuse latch arrangement MFLAT controlled by the circuitry shown in FIGS. 4a and 5a, for replacing faulty elements in the memory.

FIG. 6b is the timing diagram applicable to the block diagram of FIG. 6a.

FIGS. 8b-1 and 8b-2 are timing diagrams applicable to the block diagram shown in FIG. 8a.

DETAIL DESCRIPTION OF THE PREFERRED EMBODIMENTS

Figure 2:
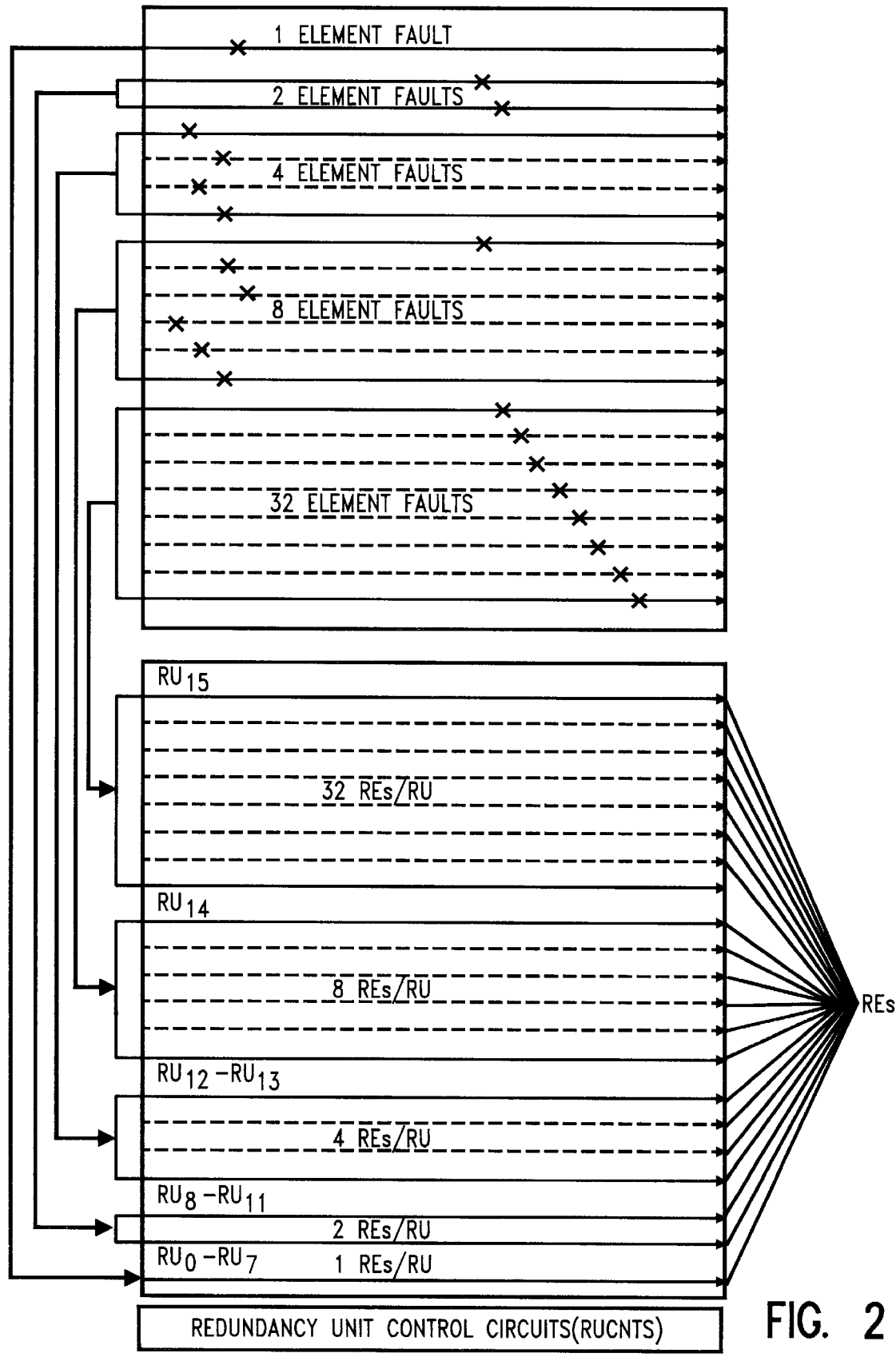
FIG. 2 shows a schematic diagram of a VSRR (Variable Size Redundancy Replacement) architecture memory which dynamically allocates RUs depending upon the type and size of fault present therein, according to the present invention.

Referring now to FIG. 2, there is shown a schematic diagram of a memory provided with a variable size redundancy replacement (VSRR) configuration. Unlike the FSRR configuration, wherein each RU comprises the same number of REs, the VSRR arrangement includes a plurality of RUs, each containing a variable number of REs. Moreover, in the VSRR arrangement, all the REs in any RU are simultaneously replaced in any given repair. By way of example, $RU_{0-7}$ (i.e., $RU_0$, $RU_1$, $RU_2$, $RU_3$, $RU_4$, $RU_5$, $RU_6$, $RU_7$), $RU_8$ (i.e., $RU_8$, $RU_9$, $RU_{10}$, $RU_{11}$), $RU_{12-13}$ (i.e., $RU_{12}$, $RU_{13}$), $RU_{14}$ and $RU_{15}$ may consist of 1, 2, 4, 8, and 32 REs, respectively. Any $RU_{0-7}$ will repair a single bit fault. Any of the $RU_{8-11}$ will repair a fault caused by a missing bit-line or a short occurring between elements. $RU_{12-13}$, $RU_{14}$ and $RU_{15}$ are preferably reserved for handling larger faults, such as a defective decoder, and the like. The RUs are controlled by their corresponding redundancy unit control circuit RUCNT, preferably located adjacent to the redundancy block.

VSRR allows the most effective and efficient RU to be used for the repair while minimizing any penalty in the RE area allocated for that purpose. Shown below (Table I) is a comparison between the FSRR and VSRR configurations depicting, for each category, the total number of elements and redundancy match detection decoders that are required for repairing a hypothetical fail distribution. Let the domain be defined as requiring the repair of one 32-element-fault, one 8 element-fault, two 4-element-faults, four 2-element-faults, and eight 1-element-faults.

TABLE I[1]

| # of Faults | 1 | 1 | 2 | 4 | 8 | Total |
|---|---|---|---|---|---|---|
| Fault Size | 32 | 8 | 4 | 2 | 1 | |
| VSRR | 32/1 | 8/1 | 8/2 | 8/4 | 8/8 | 64/16 |
| FSRR | 32/8 | 8/2 | 8/2 | 16/4 | 32/8 | 96/24 |

[1]number of REs/number of RUs

The above Table assumes FSRR requiring four elements, with one decoder to be replaced regardless the size of the fault. To repair all the assumed failures, FSRR requires 96 REs and 24 redundancy RUs, whereas VSRR requires only 64 REs and 6 RUs. More particularly, referring to column 2 of TABLE 1, there is shown a total of one 32 clustered defect that needs replacing. Under VSRR, one unit comprised of 32 REs is sufficient to repair the defect. Under FSRR, eight 4-REs would be required to achieve the same result. By way of a second example, referring to column 6 of TABLE 1, there are 8 single bit faults that need replacing. Under VSRR, eight 1-REs will suffice, whereas under a FSRR configuration, there will be a need for eight 4-REs to achieve the same result.

Figure 3:
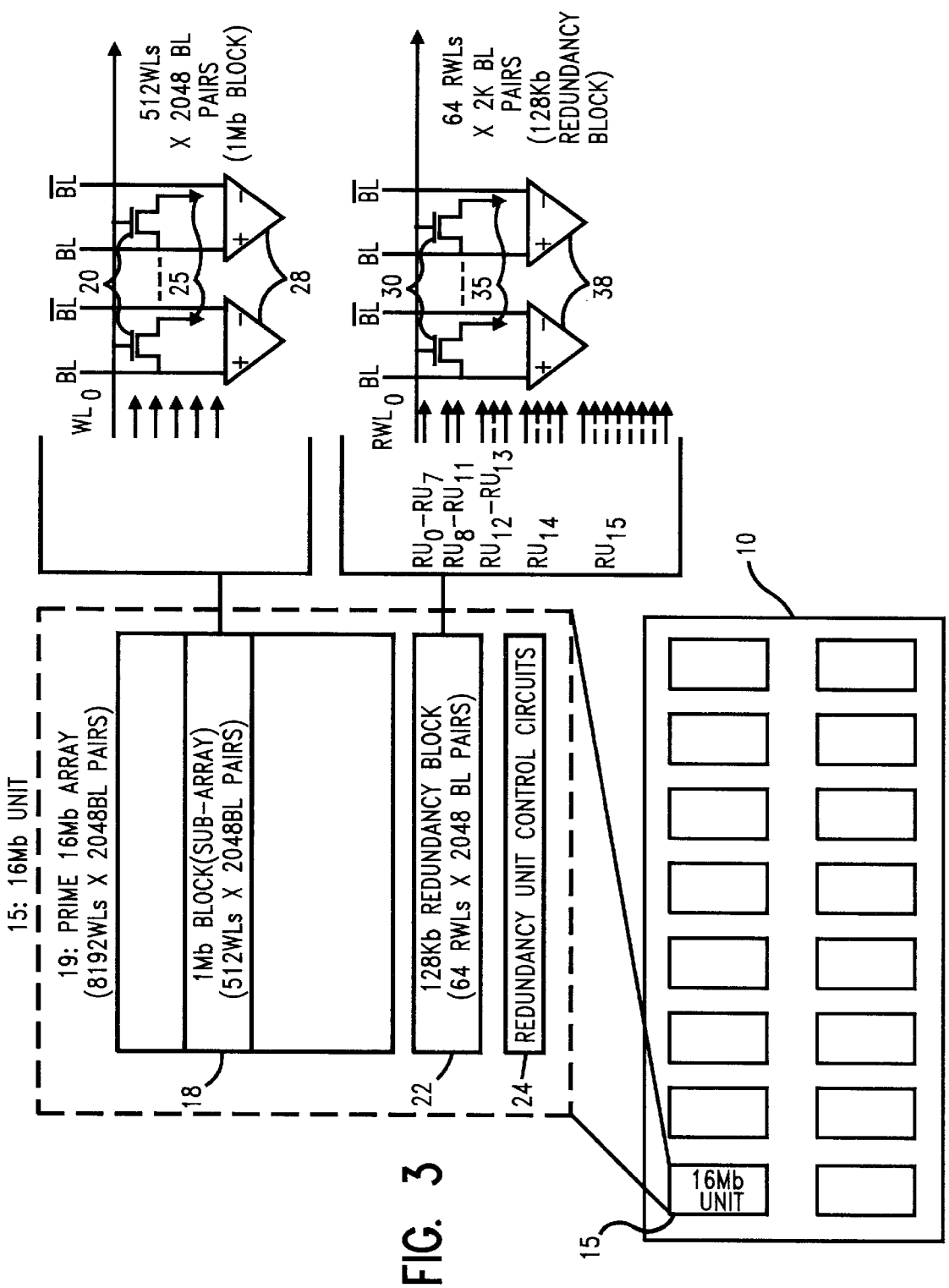
FIG. 3 is a schematic diagram of an overview of a 256 Mb DRAM showing how the VSRR configuration is used in a typical DRAM.

Referring now to FIG. 3, there is shown a schematic block representation of a 256 Mb DRAM chip 10 consisting of sixteen 16 Mb units 15. For purposes of discussion, it is assumed that the 16 Mb unit 15 defines a 'domain', i.e., a fault which can be repaired within the 16 Mb unit, and which is to be referred, hereinafter, as a flexible redundancy replacement in the 16Mb domain. The redundancy configuration, according to the present invention, applies equally well to both, the intra-block replacement and to the flexible redundancy replacement, by designing in each configuration a menu of variable sized RUs that are to replace clusters of defects. The 16 Mb unit, having 8,192 (16×512 per 1 Mb block) wordlines (WL), consists of sixteen 1Mb blocks (sub-arrays), each having 1M cells. Looking to the right of FIG. 3, every cell forming the memory array consists of an NMOS device 20 and a capacitor 25. To each wordline WL are coupled the gates of 2,048 NMOS devices 20. There are 512 WLs present in the 1Mb block (i.e., 512 WLs×2,048 cells), but only one is selected when a particular 1 Mb (out of 16) block is activated. (Note: only one WL out of 8,192 is active in the 16 Mb unit). The capacitive charge stored in capacitor 25 is transferred to the corresponding bitline BL. Sense amplifier 28 amplifies the charge on bitline BL. The amplified bit information (i.e., the data) is selected by the corresponding column address (not shown), and is transferred to a Data Output circuit (not shown).

Unlike the conventional intra-block replacement, each 1 Mb block is devoid of any redundant wordlines (RWLs). A 128 Kb redundancy block with a sixteen variable size redundancy unit $RU_{0-15}$ is designed for the 16 Mb unit to replace defective WLs in any of the sixteen 1 Mb blocks. Each $RU_{0-7}$ (redundant WL, $RWL_{0-7}$) consists of a single redundant wordline RWL. Correspondingly, each $RU_{8-11}$ ($RWL_{7-15}$) includes four RWLs ($RWL_{16-23}$), each $RU_{12}$ ($RWL_{24-31}$) and each $RU_{13}$ ($RWL_{32-63}$) include four RWLs. $RU_{14}$ and $RU_{15}$, each consist of eight and thirty-two RWLs, respectively. This makes it possible to select the most effective and efficient RU, depending on the size of the fault, thereby increasing the reliability of the unit in the presence of hard faults and retention faults. Referring back to the previous example, enabling the redundancy circuitry 24 disables all the 8,192 WLs in the primary 16 Mb array 19. Instead, 1 out of the 64 RWLs (redundant WL) in the 128 Kb redundancy block 22 is activated. The operation of the redundancy combination comprising NMOS devices 20, capacitors 25, and sense amplifiers 28 described previously also applies to the combination comprised of 30-35-38. The detailed operation of this control circuitry is described next.

Figure 4A:
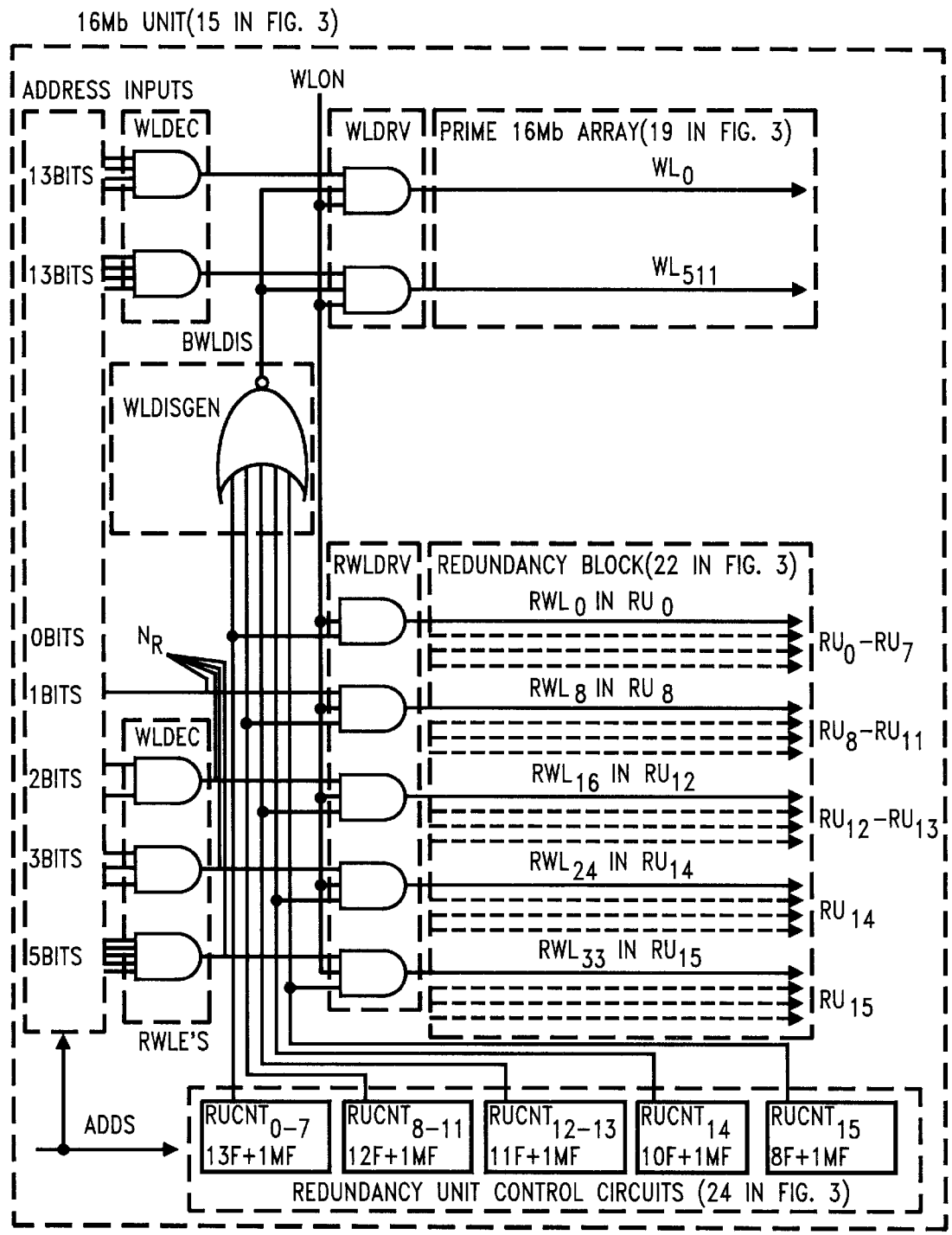
FIG. 4a shows a control circuit applicable to the VSRR configuration, according to the present invention.

The wordlines in the sixteen 1 Mb blocks and the RWLs in the redundant blocks are controlled by the appropriate variable size RU control circuit RUCNT 24 of FIG. 4a. For better performance, these are most advantageously positioned at the bottom of the redundancy block.

Referring now to FIG. 4a, showing a block representation of the variable size redundancy replacement (VSRR) control circuitry, the control circuitry includes wordline decoders (WLDEC); redundancy wordline decoders (RWLDEC); variable redundancy unit control circuits (RUCNT), represented as $RUCNT_{0-7}$, $RUCNT_{8-11}$, $RUCNT_{12-13}$, $RUCNT_{14}$, and $RUCNT_{15}$; wordline driver (WLDRV) and redundancy wordline driver (RWLDRV). To illustrate the operation of the VSRR configuration of the present invention and simplify the discussion, let us presume that only one of either, a WL (out of 8,192 in the 16 Mb primary array 19) or a RWL (out of 64, in redundancy block 22), is active in the 16 Mb unit 15 (FIG. 3). Practitioners of the art will readily appreciate that two or more WLs may be active within the 16 Mb units, at the expense of only minor modifications.

The detailed operations of 1) standby mode, 2) normal active mode, and 3) variable redundancy active mode, are described hereinafter.

Figure 4B:
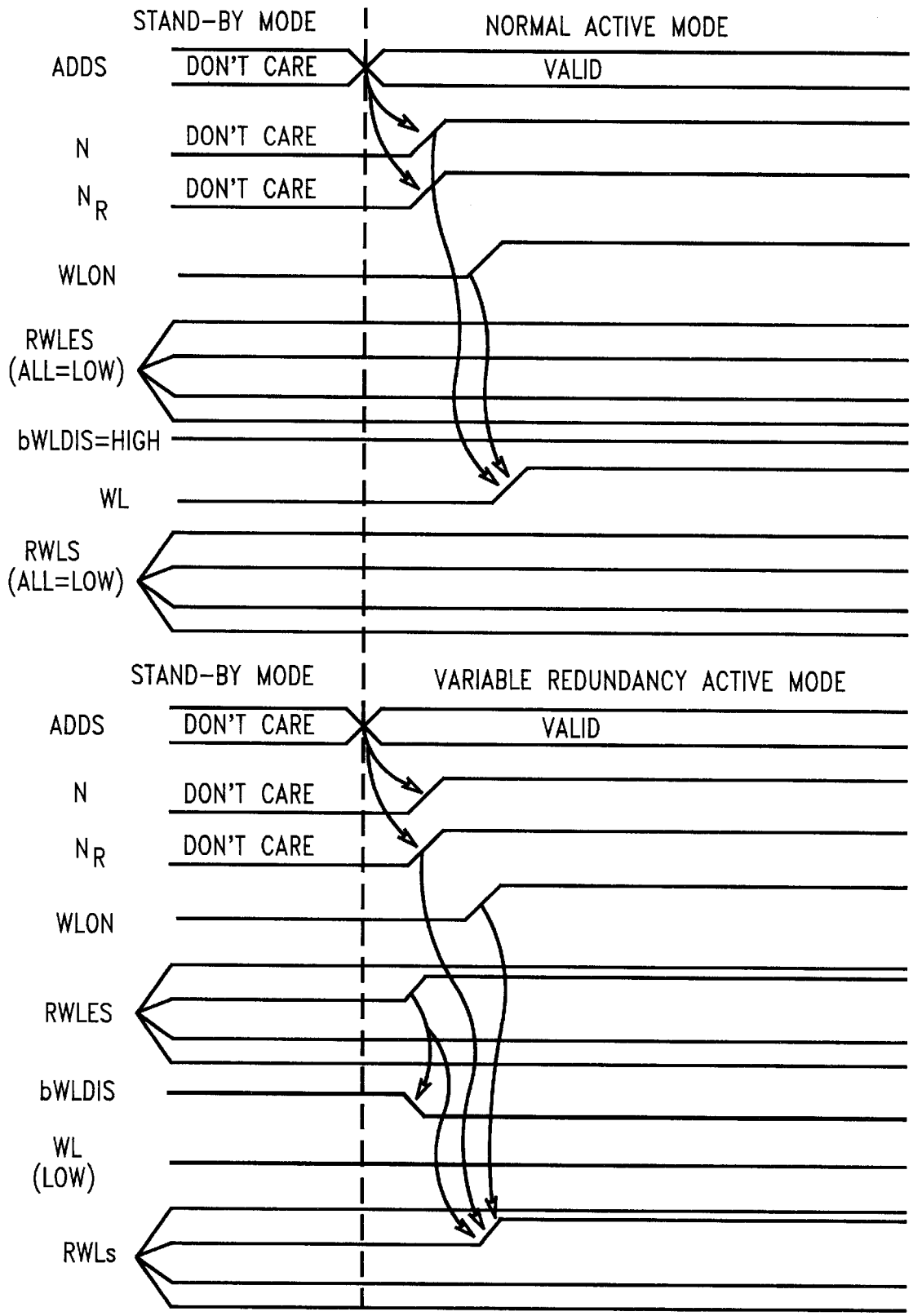

FIG. 4b shows the timing diagram for the most relevant signals: address ADDs, node N, node $N_R$, WLON, WL disable signal bWLDIS, RWLEs, WL, and RWL, referred to in FIG. 4a.

While in standby mode (i.e., when the chip is not enabled), the control line WLON remains at a low, which disables all the WLs and RWLs (all at 0), regardless of the state (i.e., "don't care" condition) of the WLDEC output N, of RWLDEC output $N_R$, and of the output RWLE of RUCNT. When the chip is enabled (i.e., in the active mode), either WL or RWL is active (but not both). When WL is enabled, the chip enters the so-called normal active mode. Alternatively, when RWL is activated (which disables WL), the chip is referred to as being in the redundancy active mode.

In a normal active mode, all the redundant word lines enable signal RWLE remain at a low, keeping the output signal (bWLDIS) of the wordline disable circuit WLDISGEN at a high. The detailed operation of the RWLE signal generation will be described hereinafter. When the 16 Mb unit 15 (FIGS. 3 and 4) is enabled, 13b address information is transferred to WLDEC, enabling one node N out of 8,192. This makes it possible to activate one WL out of the 8,192 when the signal WLON switches to a high.

While in redundancy mode, activating the redundant wordlines RWL is controlled by a two-path decoding: a) through RUCNT, and b) through RWLDEC. As previously explained, a RU consisting of several REs is controlled by the appropriate RUCNT. Each RE in the RU is controlled by the alternate path b), i.e., RWLDEC. Both decoding paths work in parallel, and a final decoding of the results of RUCNT and RWLDEC takes effect in the RWLDRV. A detailed description of the operation while in redundancy mode is described next.

The redundancy mode is typically detected by RUCNT, which activates the appropriate RWLE prior to the arrival of a signal on WLON. (The detection phase is referred to as the redundancy match detection phase). This forces the signal bWLDIS at the output of WLDISGEN to switch to 0, thereby inhibiting the wordlines in the 16 Mb unit from becoming active. During the RUCNT redundancy match detection phase, an alternate path for selecting an RE in at least one RU is decoded in RWLDEC. Concurrently, the appropriate RWLDEC is activated with address information, switching the corresponding $N_R$ to a 1. The number of address bits used for RWLDEC sets the bits required for decoding the appropriate number of REs in the corresponding RU. This path is independently controlled no matter if it is in a redundancy mode or in normal mode. The final decision to activate an RWL is determined by the decoding result of $N_R$ and RWLE in RWLDRV. The aforementioned two path decoding makes it possible for one RWL to become active (without incurring in speed penalties) by means of appropriate addressing, which had already been previously decoded when WLON switched to a high.

RWLDEC is provided with a variable size redundancy decoder that makes it possible to implement the VSRR configuration of the present invention. By way of example, for a single wordline replacement no decoder is required, and the RWLE signal generated by the RUCNT directly controls the appropriate RWLE driver. A 2 WL, 4 WL, 8WL, and 32 WL replacement requires 1 bit (1b), 2 bits (2b), 3b, and 5b decoders, respectively, at the corresponding RWLDEC. This, in turn, activates the appropriate node $N_R$ in accordance with address inputs ADD.

Figure 5A:
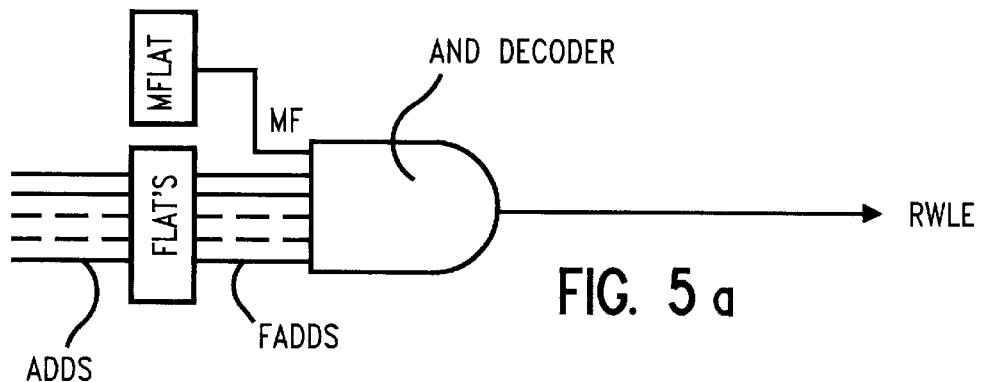
FIG. 5a is a schematic of a block diagram of the redundancy unit control decoder, according to the present invention.
Figure 5B:
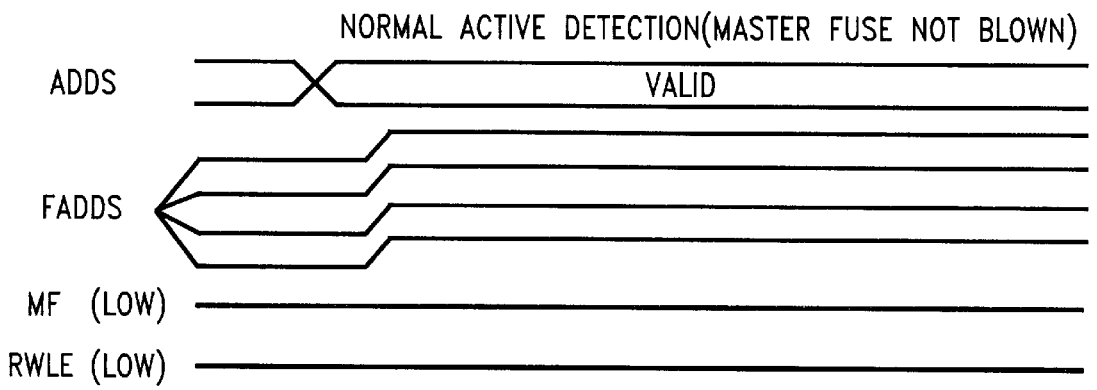
Figure 5B:
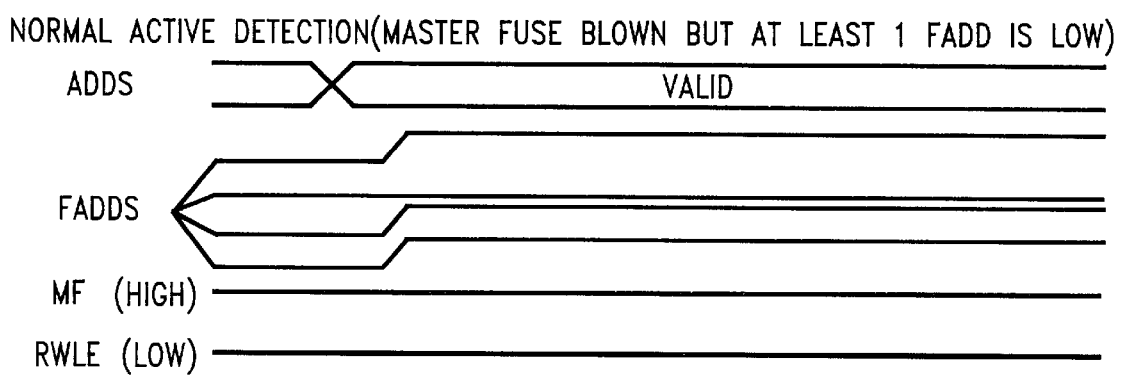
Figure 5B:
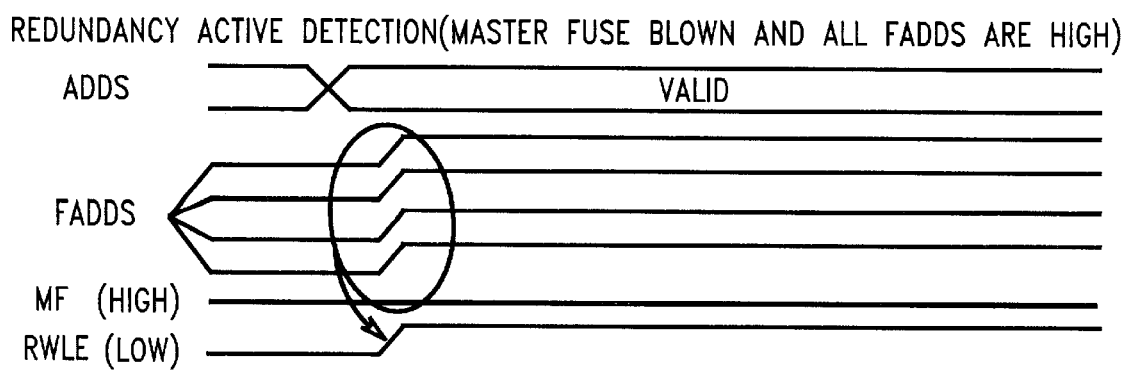

Referring now to FIGS. 5a and 5b respectively, there is shown a block diagram and the timing diagram of a single RU control circuit RUCNT. This circuit is provided with a plurality of fuse latches FLATs driving a decoder (i.e., an AND gate). The only difference between a conventional FSRR control circuit and the VSRR control circuit RUCNT resides in the number of fuses that are required for each variable replacement. It is determined by the number of bits for each RUCNT required by the VSRR configuration. Additionally, one master fuse MFLAT is also needed for each RUCNT.

For a single bit replacement $RUCNT_{0-7}$, 13 bits are needed to decode one of the 8 k wordlines in the 16 Mb unit. This requires 13 FLATs and one master FLAT (MFLAT), labeled 13 F+1 MF in FIG. 4a. For a 2 WL replacement $RUCNT_{8-12}$, one bit can be saved, resulting in 12 fuses and one master fuse (12 F+1 MF). For 4 WL, 8 WL and 32 WL replacements, 11, 10 and 8 fuses and one master fuse are, respectively, required per RUCNT (11 F+1 MF, 10 F+1 MF and 8 F+1 MF). A detailed description of its operation follows next.

In order to enable a RUCNT, the master fuse needs to be blown. As long as the master fuse remains intact, the output MF of MFLAT (FIG. 5b) stays at 0. The output RWLE of the AND gate, there fore, remains at 0, regardless of the address. When the master fuse is blown (MF set at 1), RWLE is controlled by the combination of outputs of FLAT, i.e., FADD. FADD switches to 0 when the corresponding address input ADD fails to match the programmed fuse information. Alter natively, FADD switches to 1 when the corresponding ADD matches the programmed fuse information. Only when all the fuse programmed addresses match the ADD inputs, and MF is blown, thereby RWLE switching to 1.

Figure 6:
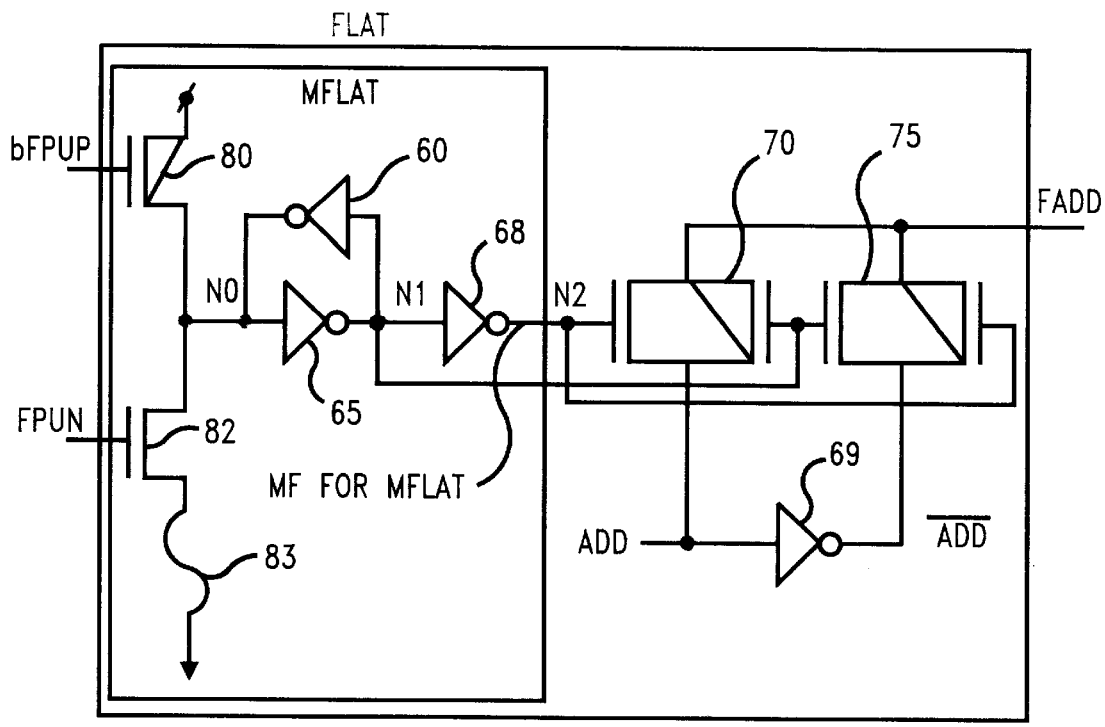
Figure 6:
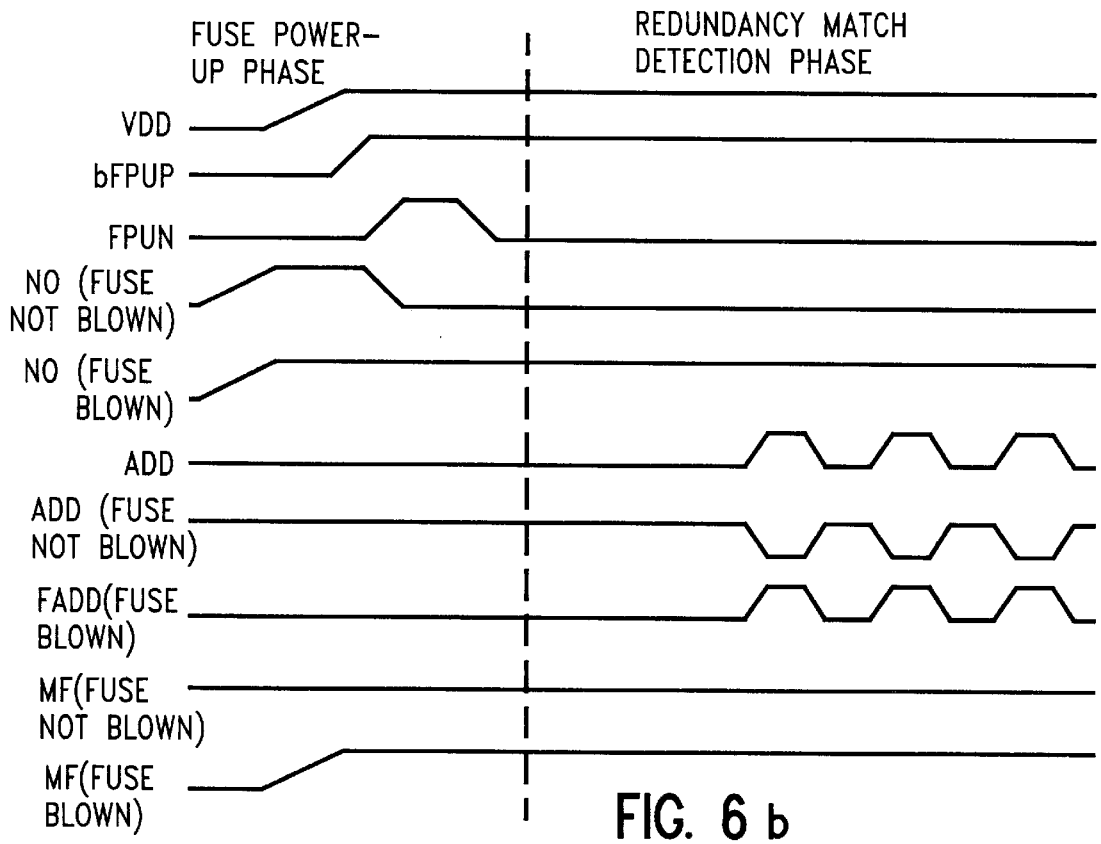

Referring now to FIG. 6a, there is shown a schematic diagram for the fuse latch FLAT, wherein FLAT is depicted as an address-fuse comparator. A CMOS latch, formed by 60, 65 and 68, is set by devices 80 nd 82 during the power-up phase of the chip by FPUP and FPUN, as shown in the diagram of FIG. 6b. If fuse 83 is not blown at power-up, nodes N0, N1, and N2 are set to 0, 1 and 0, respectively. Alternatively, if fuse 83 is blown, nodes N0, N1 and N2 are set to 1, 0, and 1, respectively. Those states of nodes N0, N1 and N2 are latched in CMOS latch circuits 60, 65 and 68. Either of the CMOS transfer gates 70 and 75 opens up, depending on the state of nodes N1 and N2. ADD and $\overline{ADD}$ (inverted by circuit 69) are coupled to the CMOS transfer gates 70 and 75, respectively. As long as the fuse remains intact (i.e., at 0), the output FADD of FLAT 47 follows $\overline{ADD}$. When the fuse is blown, FADD follows ADD. FADD switches to 1 when both ADD and the fuse are either 0 or 1, resulting in an address and fuse match detection.

Within the circuit FLAT of FIG. 6a is included the circuit MFLAT (or Master FLAT), which is shown alongside with appropriate timing curves (FIG. 6b). The CMOS latch, formed by 60, 65 and 68, is set during the power-up phase of the chip by FPUP and FPUN, as depicted in the diagram. If, during power-up, fuse 83 is not blown, then N0, N1 and N2 (also referred to as MF) switch to 0, 1, 0, respectively. With MF at 0, the AND gate in RUCNT (FIG. 5a) is disabled. If, on the other hand, fuse 83 is blown, then, at power-up, N0, N1 and N2 (also referred to as MF) switch to 1, 0, 1, respectively, while MF is at 1, which enables the AND gate in RUCNT (FIG. 5).

Figure 1A:
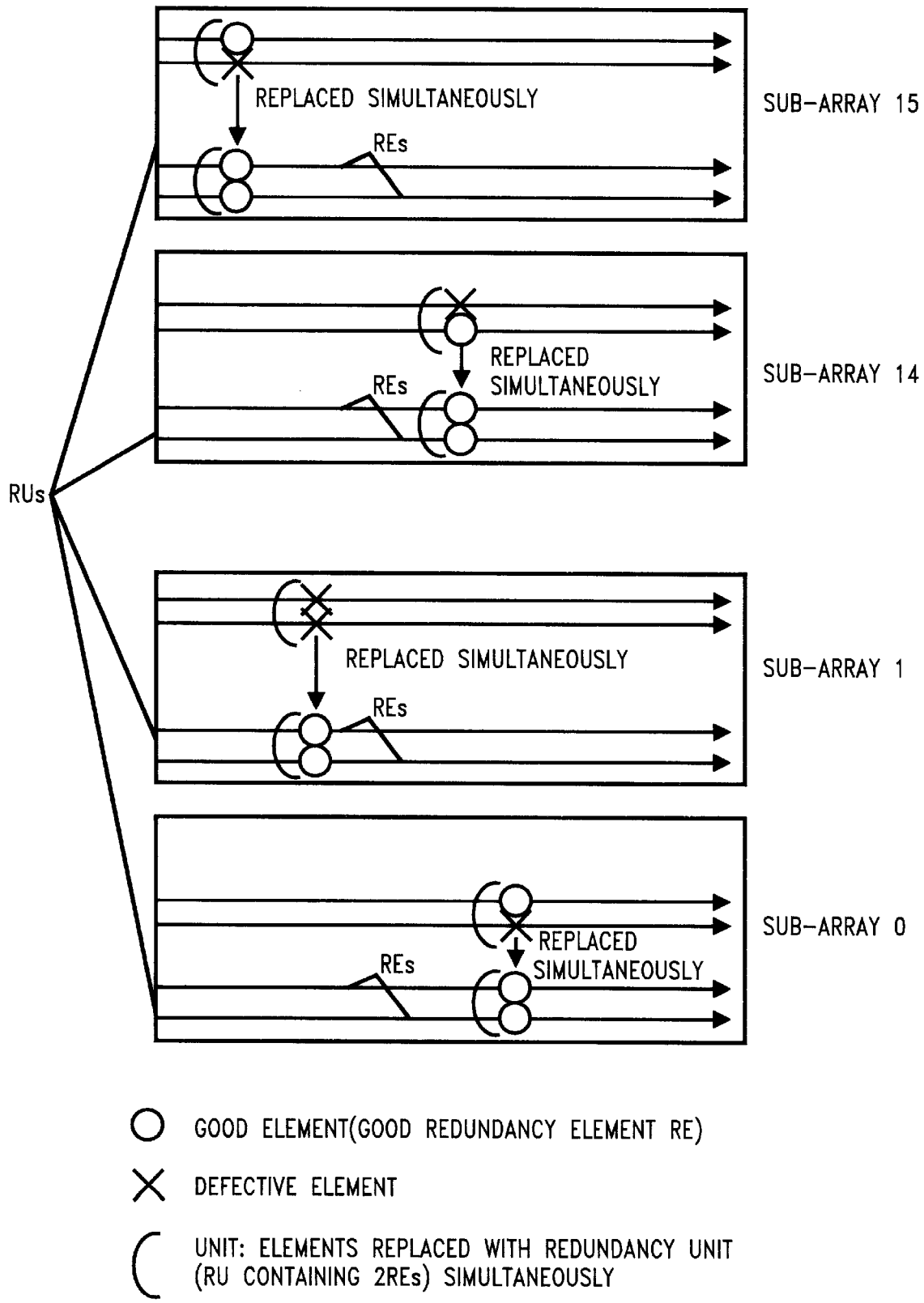
FIG. 1a shows a schematic representation of a memory provided with a conventional FSRR intra-block replacement scheme, and showing how failing rows in the various sections of the memory are corrected with REs replacing failing ones in each corresponding section.
Figure 1B:
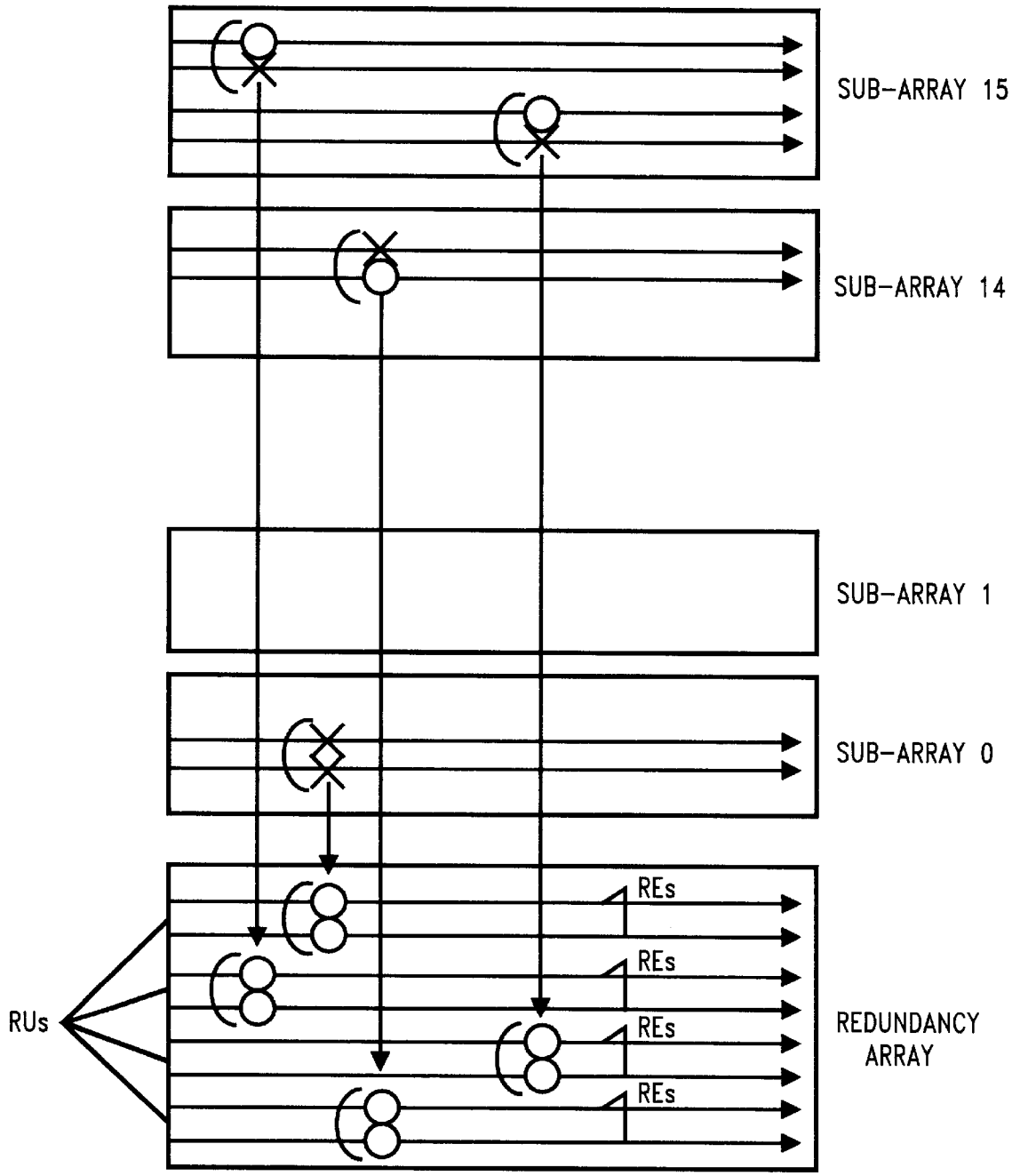
FIG. 1b shows a schematic diagram of a memory provided with a conventional FSRR flexible redundancy replacement scheme, wherein an array of REs clustered at one end of the memory is used to selectively replace failing rows anywhere within the memory.
Figure 1C:
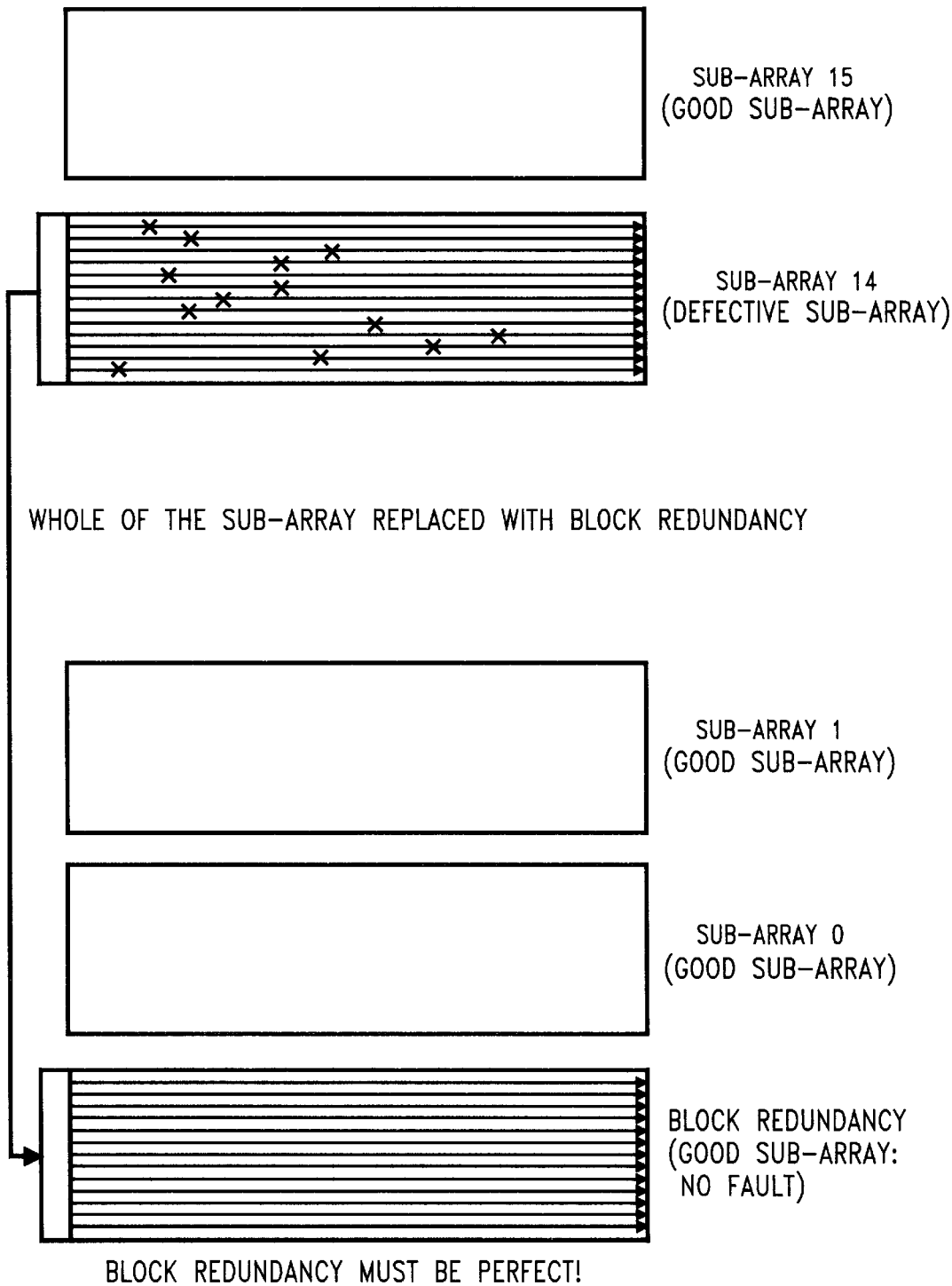
FIG. 1c shows a schematic diagram of a memory provided with a conventional block FSRR scheme, wherein a good block formed by a plurality of REs replaces a block of equivalent size within the memory.
Figure 7:
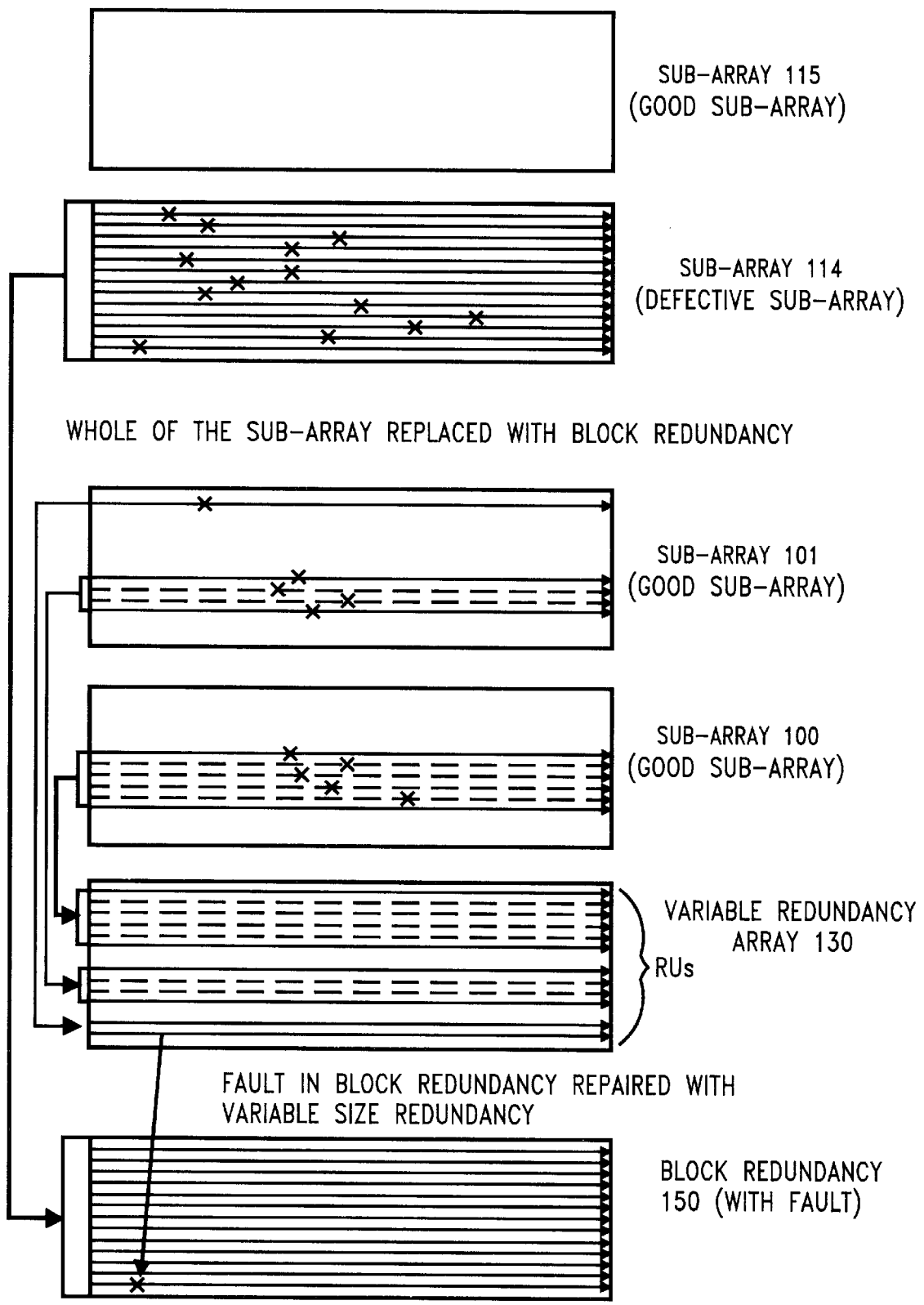
FIG. 7 is a schematic diagram of an embodiment applicable to the block FSRR architecture of FIG. 1c, wherein a RE in a line redundancy array corrects defects in both, the primary memory array and in the redundancy block array.

Referring now to FIG. 7, there is shown another embodiment of the present invention, namely, a fault tolerant block redundancy replacement configuration applicable to the conventional block architecture of FIG. 1c. A primary memory array is illustrated therein, structured as a plurality of sub-arrays 0–15 (labeled 100–115). A block redundancy array 150, preferably positioned at the bottom of the primary memory array, is assumed to contain at least one defect. Let it be further assumed that sub-array 114 within the primary memory array contains a large number of faults (labeled X). Block redundancy 150 can, in this instant case, be used to replace sub-array 114 in its totality.

Practitioners of the art will fully realize that defects can occur in any of the sub-arrays that form the memory device, irrespective if a primary memory array, a redundancy block array or a redundancy unit (in the VSRR configuration). As such, the presence of a defect in the redundancy block array can pose serious performance problems in any replacement scheme, since redundancy arrays are presumed to be good, when in reality they may be defective.

In accordance to the present invention, and further with reference to FIG. 7, the redundancy array 130 is now structured within the memory device as having the capability of correcting defects within the block redundancy array, allowing a defective block redundancy array to replace large portions of the primary array. To enable such a repair, redundancy block 150 is tested, and any defects found are repaired by assigning RUs contained in the variable redundancy array 130.

The configuration of FIG. 7 may generally be viewed as a combination of the inventive concepts described in the VSRR configuration of FIG. 2, as applied to the block redundancy arrangement shown in FIG. 1c. RUs within the variable redundancy array 130 can now cure defects within any of the sub-arrays 100–115 or in the block redundancy array 150. If the number of defects within a sub-array, e.g., 114, is found to exceed a predetermined number, initially, block 150 is made defect free, and only then it is used to replace sub-array 114.

Figure 8A:
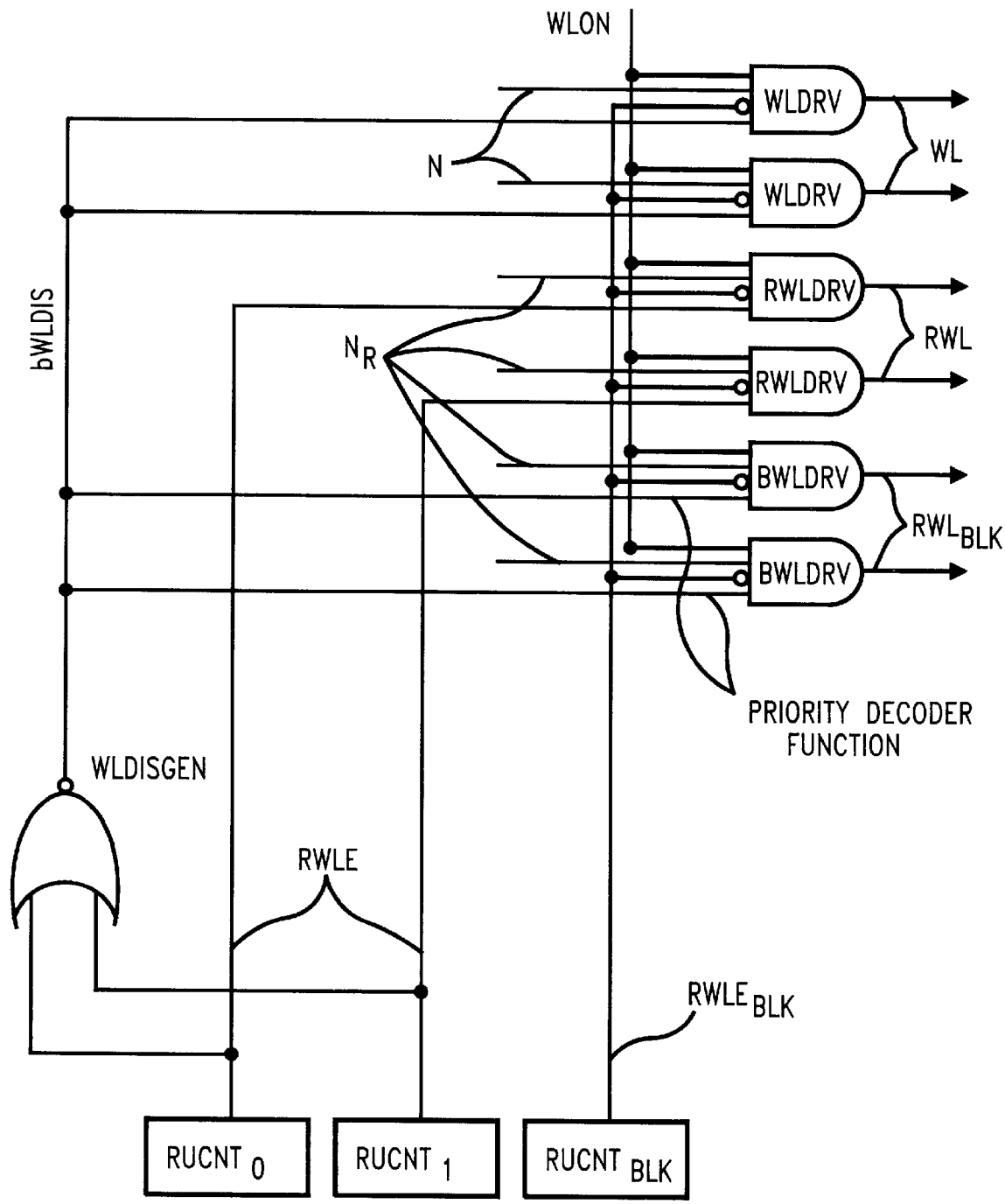
FIG. 8a is a schematic diagram of the priority decoder used for the line and block redundancy configuration of FIG. 7.
Figure 8:
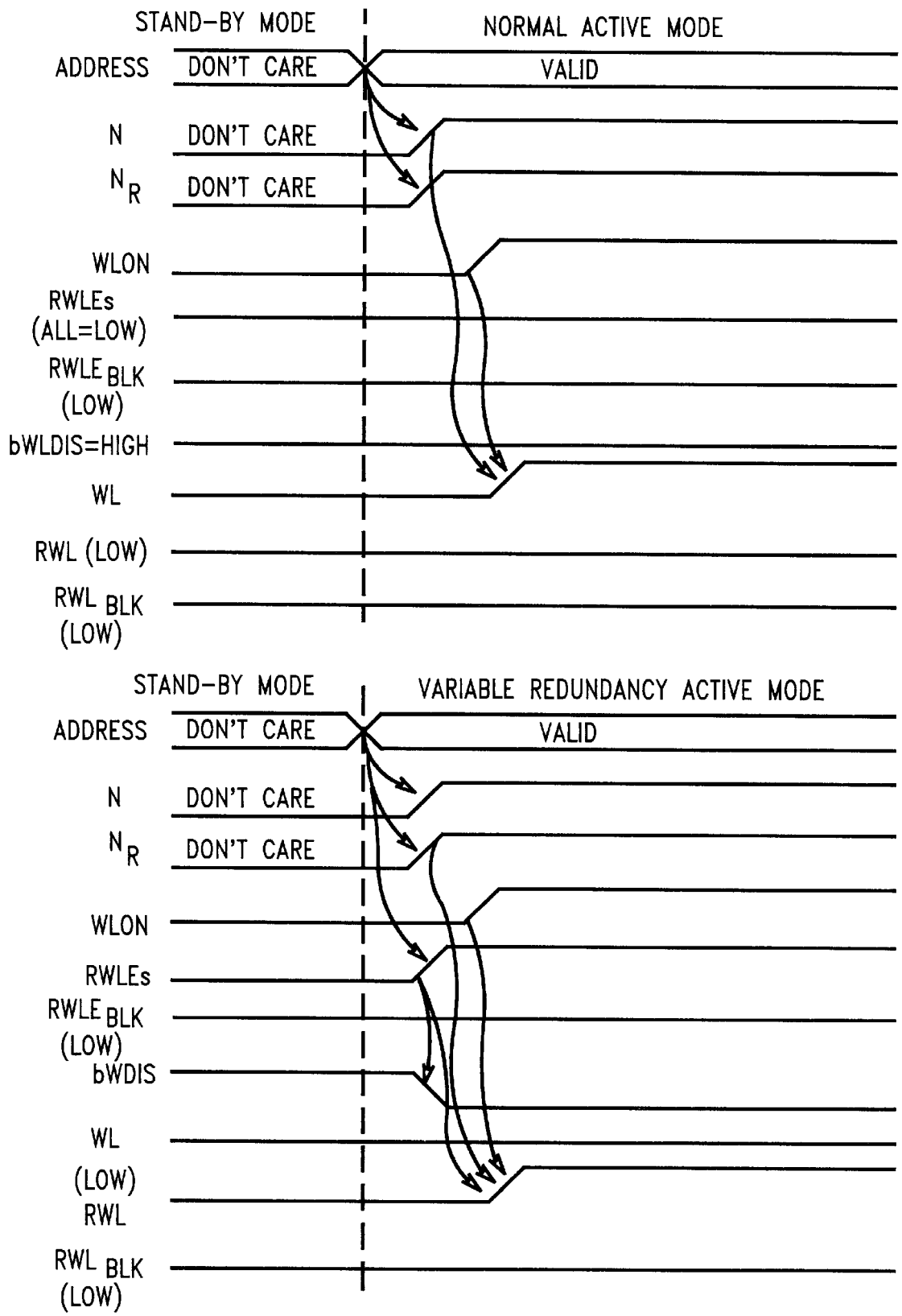
Figure 8:
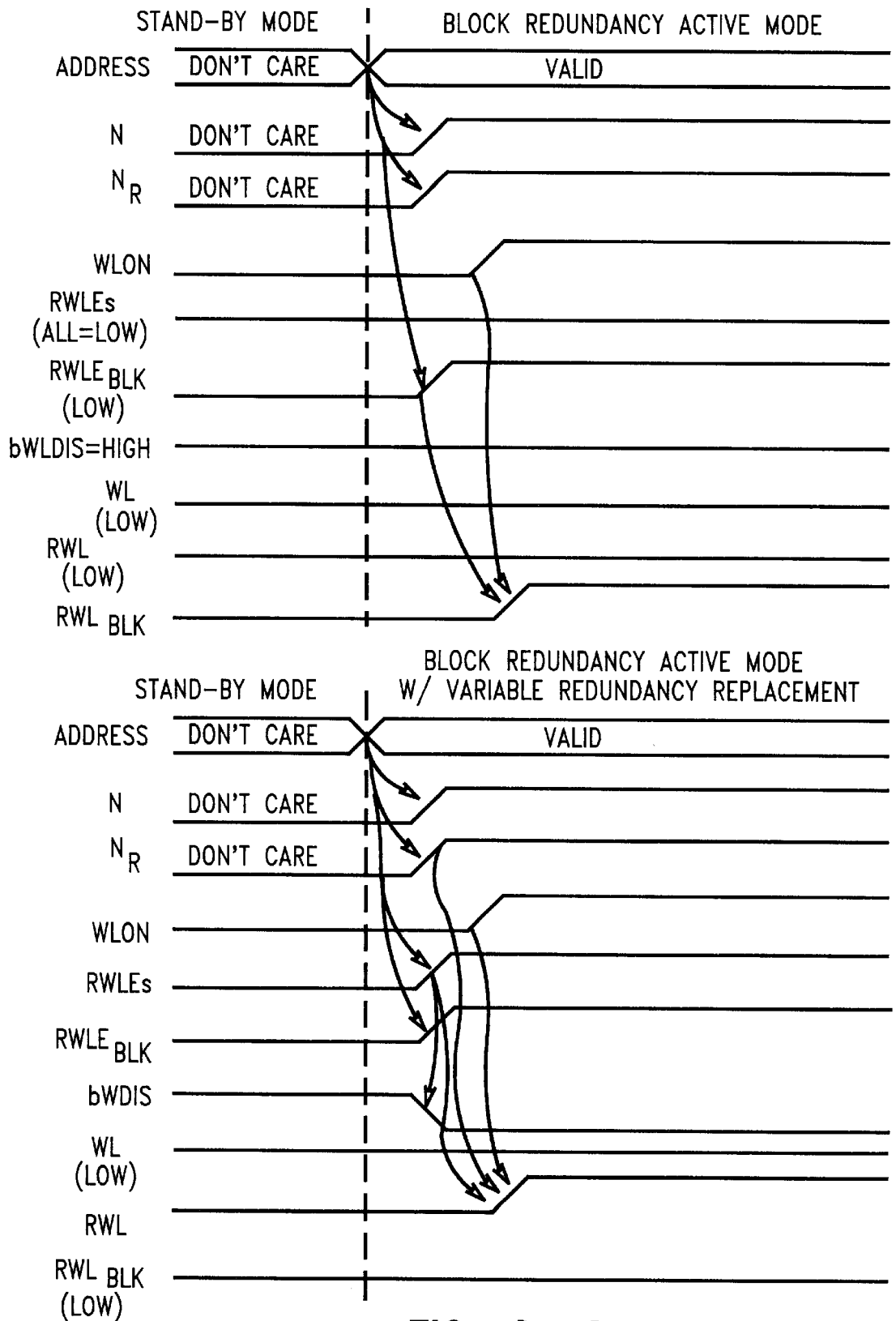

Referring now to FIG. 8a, there is shown a schematic diagram of the priority decoder, according to the present invention, that orchestrates the replacement of defective arrays within the memory with a defect-free block redundancy array. The priority decoder allows primary array 114 and block redundancy array 150 to be simultaneously checked for a redundancy replacement, resulting in no-access penalty. Therein is also depicted a block diagram which includes: two variable size RU control circuits RUCNT0 and RUCNT1, a block redundancy control circuit $RUCNT_{BLK}$, wordline disable generator WLDISGEN, wordline driver WLDRV, redundancy wordline driver RWLDRV and block redundancy wordline drivers BWLDRV. WL decoder WLDEC, RWL decoder RWLDEC, and block redundancy WL driver are not shown in FIG. 8a, although a parallel may be drawn to corresponding elements in FIG. 4a, via nodes N and $N_R$. The basic control flow is the same as that described with reference to FIG. 4a.

Four operations are applicable to the above configuration: 1) normal operation, 2) variable redundant operation, 3) block redundancy operation, and 4) a replacement mode operation, wherein faults in the block redundancy are replaced by a VSRR arrangement. During operations 1) and 2), the output $RWLE_{BLK}$ of $RUCNT_{BLK}$ remains at 0, allowing WLs and RWLs to be controlled in the manner described for VSRR in reference to FIG. 4.

While in mode 1), all RWLEs remain at 0 and bWLDIS at 1. Accordingly, when WLON switches to 1, the corresponding WL is enabled by the appropriate node N.

While in mode 2), the appropriate RWLE switches to 1, forcing bWLDIS to 0. As a result, when WLON switches to 1, the corresponding RWL selected by the appropriate RWLE and node $N_R$ switches to 1. The switch of RWLE to 1 makes bWLDIS switch to 0, disabling the appropriate WL in the primary array.

While in mode 3), all RWLEs remain at 0, keeping bWLDIS at 1. Alternatively, $RUCNT_{BLK}$ detects a block redundancy mode impacting $RWLE_{BLK}$ depending on the state of the node $N_R$. This enables BWLDRV and disables WLDRV. Accordingly, when signal WLON switches to 1, the corresponding RWL in the block redundancy is activated, disabling WL.

While in mode 4), $RUCNT_{BLK}$ and a variable RUCNT detect the block redundancy replacement mode and the VSRR mode, simultaneously. However, only RWLDRV (in the VSRR configuration) is enabled, because of the high value taken by bWLDIS, concurrently disabling WLDRV and BWLDRV. It follows that VSRR takes precedence over the block redundancy replacement mode. Alternatively, VSRR has a higher priority than the block redundancy replacement, which is achieved with bWLDIS gating both WLDRV and BWLDRV (a function which is referred to as priority decoding). It is, therefore, possible to repair faulty elements with other VSRR means even when a faulty element is part of a redundancy block. There is no access penalty because the match detections of the block redundancy and of the VSRR can work simultaneously, although the decision of either operation is made only much later with the priority decoder. The above described concept can be effectively applied to allow a fault-tolerant variable size RU containing a number of defective REs to repair defective RUs with other RUs of smaller size.

The present invention described herein may be designed in many different memory configuration schemes. While the present invention has been described in terms of various embodiments, other embodiments may come to mind to those skilled in the art without departing from the spirit and scope of the present invention. The invention should then be measured in terms of the claims that follow.

What is claimed is:

1. A method of providing a memory device with a variable redundancy replacement arrangement to make said memory device fault tolerant, said method comprising the steps of:

providing a plurality of primary memory arrays each having a plurality of elements;

coupling a plurality of independently controlled variable size redundancy units to said primary memory arrays, said variable size redundancy units each having a plurality of redundancy elements;

providing a block redundancy array coupled to said primary memory arrays; and replacing defective elements in said primary memory arrays and in said block redundancy array with at least one of said variable size redundancy units, wherein said redundancy elements in said at least one of said variable size redundancy units replace a corresponding number of defective elements in said primary memory arrays and in said block redundancy array.

2. The method of claim 1, wherein said block redundancy array replaces one of said primary memory arrays.

3. The method of claim 1, wherein repair means repairs defectives elements in said block redundancy array, and wherein said repaired block redundancy array subsequently replaces one of said primary memory arrays.

4. The method of claim 3, wherein said repair means further comprises a redundancy array.

5. The method of claim 4, wherein said repair means further comprises at least one variable size redundancy unit.

6. The method of claim 4, wherein said repair means further comprises an intra-block redundancy unit.

7. The method of claim 3, wherein said repair means further comprises a flexible redundancy unit.

8. The method of claim 1, wherein repair means repairs defectives elements in said block redundancy array, said repaired block redundancy array simultaneously replacing one of said primary memory arrays.

9. A method of providing a memory device with a variable redundancy replacement arrangement to make said memory device fault tolerant, said method comprising the steps of:

a) configuring the memory device into a plurality of primary memory arrays each having a plurality of elements;

b) coupling a plurality of independently controlled variable size redundancy units to said primary memory arrays, said variable size redundancy units each having a plurality of redundancy elements;

c) coupling a block redundancy array to said primary memory arrays;

d) replacing defective elements in said primary memory arrays and in said block redundancy array with at least one of said variable size redundancy units;

e) replacing a corresponding number of defective elements in said primary memory array and in said block redundancy array with said redundancy elements in said at least one variable size redundancy unit; and f) decoding at least one of redundancy wordlines and disabling a corresponding defective one of wordlines.

10. The method as recited in claim 9, wherein said decoding step f) is performed by a circuit that comprises:

redundancy wordline decoders controlling said redundancy wordlines, each of said decoders having a plurality of inputs, said inputs providing a different decoding configuration.

11. The method as recited in claim 10, wherein each of said redundancy wordline decoders controls a redundancy wordline driver, and wherein said driver is attached to one of said redundancy wordlines.

12. The method as recited in claim 11, wherein the number of inputs of said redundancy wordline decoder corresponds to the number of said redundancy elements in said variable size redundancy units.

13. The method as recited in claim 10, wherein said redundancy wordline decoders are controlled by addressing decoding means, said addressing decoding means being activated independently of redundant matching detection means that are coupled to said redundancy wordlines.

14. A method of providing a memory device with a variable redundancy replacement arrangement to make said memory device fault tolerant, said method comprising the steps of:

providing a plurality of primary memory arrays each having a plurality of elements;

coupling a plurality of independently controlled variable size redundancy units to said primary memory arrays, said variable size redundancy units each having a plurality of elements;

replacing a defective variable size redundancy unit with another variable size redundancy unit having less elements than the number of said elements in said defective variable size redundancy unit; and replacing defective elements in said primary memory arrays with at least one of said variable size redundancy units, wherein said elements in said at least one of said variable size redundancy units replace a corresponding number of defective elements in said primary memory arrays.

* * * * *